United States Patent
Hiroki et al.

(10) Patent No.: US 9,165,810 B2
(45) Date of Patent: Oct. 20, 2015

(54) CONVEYANCE DEVICE AND SUBSTRATE PROCESSING SYSTEM

(71) Applicant: TOKYO ELECTRON LIMITED, Tokyo (JP)

(72) Inventors: Tsutomu Hiroki, Nirasaki (JP); Ikuo Sawada, Kawasaki (JP); Kazuyoshi Matsuzaki, Tsukuba (JP); Yoshiki Fukuhara, Tsukuba (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/361,869

(22) PCT Filed: Nov. 28, 2012

(86) PCT No.: PCT/JP2012/080766
§ 371 (c)(1),
(2) Date: May 30, 2014

(87) PCT Pub. No.: WO2013/081013
PCT Pub. Date: Jun. 6, 2013

(65) Prior Publication Data
US 2015/0125238 A1 May 7, 2015

(30) Foreign Application Priority Data
Dec. 1, 2011 (JP) ................................. 2011-264099

(51) Int. Cl.
*H01L 21/677* (2006.01)
*H01L 21/67* (2006.01)

(52) U.S. Cl.
CPC .... *H01L 21/67766* (2013.01); *H01L 21/67017* (2013.01)

(58) Field of Classification Search
CPC .. H01L 21/677; H01L 21/67766; H01L 21/68
USPC .......................................................... 414/217
See application file for complete search history.

(56) References Cited

U.S. PATENT DOCUMENTS

| 8,423,175 B2* | 4/2013 | Abe et al. ........................ 700/214 |
| 8,518,187 B2* | 8/2013 | Ikari ................................. 134/1 |

(Continued)

FOREIGN PATENT DOCUMENTS

| JP | 6-77245 U | 10/1994 |
| JP | 11-31730 A | 2/1999 |

(Continued)

OTHER PUBLICATIONS

Search Report issued International Application No. PCT/JP2012/080766 dated Feb. 26, 2013, two (2) pages.

*Primary Examiner* — Saul Rodriguez
*Assistant Examiner* — Ashley Romano
(74) *Attorney, Agent, or Firm* — Nath, Goldberg & Meyer; Jerald L. Meyer (57) ABSTRACT

A conveyance device, which conveys wafers in a casing 30, includes a primary blowing fan 17 that generates airflow within the casing 30 in a first direction; a discharge opening 26 that is located at a downstream side of the airflow generated by the primary blowing fan 17, is interconnected with the interior of the casing 30, and discharges gases at the interior of the casing 30 outside of the casing 30; a base 18*d* that is supported by a gate-shaped conveyance arm 22 disposed within the casing 30 and moves within the casing 30 at the upstream side of the discharge opening 26 and at the downstream side of the primary blowing fan 17; an end effector 21 that is located at the base 18*d* and that carries wafers; and a blowing fan 19 that is located at the base and that generates airflow in the first direction.

12 Claims, 11 Drawing Sheets

(56) References Cited

U.S. PATENT DOCUMENTS

| | | | |
|---|---|---|---|
| 8,950,999 B2 * | 2/2015 | Tamura et al. | 414/217 |
| 2004/0029300 A1 * | 2/2004 | Iijima et al. | 438/14 |
| 2004/0144316 A1 * | 7/2004 | Lee et al. | 118/719 |
| 2006/0018736 A1 * | 1/2006 | Lee et al. | 414/217 |
| 2007/0233313 A1 * | 10/2007 | Ikari | 700/213 |
| 2009/0081005 A1 * | 3/2009 | Miyasaka | 414/217 |

FOREIGN PATENT DOCUMENTS

| | | |
|---|---|---|
| JP | 11031730 A | 2/1999 |
| JP | 2003-007799 A | 1/2003 |
| JP | 2009-032877 A | 2/2009 |
| JP | 2011-517134 A | 5/2011 |
| JP | 2009-76805 A | 4/2014 |
| KR | 1020100135293 A | 12/2010 |

* cited by examiner

CONVEYANCE DEVICE AND SUBSTRATE PROCESSING SYSTEM

This is a National Phase Application filed under 35 U.S.C. 371 as a national stage of PCT/JP2012/080766, filed Nov. 28, 2012, and claims priority benefit from Japanese Application No. 2011-264099, filed on Dec. 1, 2011, the content of each of which is hereby incorporated by reference in its entirety.

TECHNICAL FIELD

Various aspects and embodiments of the present disclosure relate to a conveyance device which conveys a conveyance object within a casing, and a substrate processing system.

BACKGROUND

In the related art, there is known a device which conveys a conveyance object within a casing (see, e.g., Patent Document 1). The device disclosed in Patent Document 1, which is a device that conveys a workpiece such as a semiconductor wafer or the like, includes an accommodating box, a conveyance chamber, a load lock and a processing chamber. A semiconductor wafer accommodated within the accommodating box is carried out by a conveyance unit disposed within the conveyance chamber, and carried into the load lock to be subjected to specified processing within the processing chamber. The semiconductor wafer thus processed is carried out from the load lock by the conveyance unit, and carried into the accommodating box or conveyed to a load lock connected to another processing chamber. A blowing fan that generates airflow (a down-flow) from an upper side toward a lower side of the conveyance chamber and a filter are located in an upper area within the conveyance chamber. A ventilation outlet is provided in a bottom portion of the conveyance chamber. The conveyance chamber is configured such that clean gas is circulated by the blowing fan and the ventilation outlet.

PRIOR ART DOCUMENTS

Patent Documents

Patent Document 1: Japanese laid-open publication No. 2003-7799

When a wafer has undergone processing such as etching or depositing, a gas involved in corrosion may sometimes be generated from the wafer. In the related art, it is desirable to suppress diffusion of the gas within a casing such as a conveyance chamber or the like.

SUMMARY

One aspect of the present disclosure is directed to a conveyance device for conveying a conveyance object within a casing, including: a first blowing unit configured to generate an airflow in a first direction within the casing; a discharge opening provided at a downstream side of the airflow generated by the first blowing unit and kept in communication with an interior of the casing, the discharge opening configured to discharge a gas existing within the casing outside of the casing; a moving unit supported by a first drive mechanism arranged within the casing, the moving unit configured to move within the casing at a more downstream side than the first blowing unit and at a more upstream side than the discharge opening; an end effector provided in the moving unit and configured to mount the conveyance object thereon; and a second blowing unit provided in the moving unit and configured to generate an airflow in the first direction.

The airflow generated by the first blowing unit reaches the end effector on which the conveyance object is mounted. Thereafter, the airflow reaches the discharge opening. The airflow generated by the second blowing unit reaches the discharge opening while drawing the gas existing near the end effector. The gas generated from the conveyance object reaches the discharge opening together with the airflow generated by the second blowing unit. Thus, the airflow generated by the second blowing unit makes it possible to exhaust the gas while suppressing diffusion of the gas into the casing.

In this regard, the moving unit may include a wind screen portion interposed between the end effector and the first blowing unit and configured to obstruct the airflow generated by the first blowing unit and moving in the first direction. The second blowing unit may be arranged at a more downstream side than the wind screen portion. This configuration can prevent the airflow generated by the first blowing unit from directly reaching the conveyance object. It is therefore possible to further suppress diffusion of the gas generated from the conveyance object.

The wind screen portion may be formed in a box shape and configured to accommodate the end effector therein. The second blowing unit may be accommodated within a tubular first duct member and provided in the moving unit. This configuration makes it possible to draw the gas generated from the conveyance object into the airflow generated by the second blowing unit, thereby properly exhausting the gas.

The first duct member may be formed in a taper shape so as to become thinner toward a downstream side. This configuration makes it possible to properly orient the airflow generated by the second blowing unit toward the discharge opening and to appropriately cause the airflow to reach the discharge opening at an increased velocity.

The end effector may be supported on the moving unit by an arm portion capable of extending and retracting. The wind screen portion may include a window portion through which the arm portion and the end effector can pass. With this configuration, the delivery of the conveyance object and the suppression of diffusion of the gas can be made compatible.

The second blowing unit may include a tubular body portion opened at the opposite ends thereof and an ejecting portion formed along an inner side of the body portion and configured to eject a gas in the first direction. The second blowing unit may be provided in the moving unit such that a center axis of the body portion is oriented in the first direction and such that the end effector is positioned inside an opening of the body portion as viewed in the first direction. This configuration makes it possible to increase the velocity and the directivity of the airflow generated by the second blowing unit.

The second blowing unit may be supported on the moving unit by a second drive mechanism in the first direction. This configuration makes it possible to change the position of the second blowing unit without changing the direction of the airflow generated by the second blowing unit.

The conveyance device may further include: a control unit configured to control an operation of the second drive mechanism so as to change a relative position of the second blowing unit and the end effector between the time when the conveyance object is mounted on the end effector and when the conveyance object mounted on the end effector is moved. With this configuration, the relative position of the second blowing unit and the end effector can be changed between during the delivery of the conveyance object and during the conveyance of the conveyance object. Thus, the delivery of the conveyance object and the suppression of diffusion of the gas can be made compatible.

When the conveyance object mounted on the end effector is moved, the control unit may control the operation of the second drive mechanism so as to move the second blowing unit to a position where the end effector is accommodated within the second blowing unit. This configuration makes it possible to suppress diffusion of the gas during the conveyance of the conveyance object.

A tubular second duct member provided so as to surround the discharge opening may be provided on an inner wall of the casing at a downstream side of the second blowing unit. With this configuration, the second duct member properly receives the gas sent from the second blowing unit, suppressing diffusion of the gas.

The second duct member may be provided along a movement route of the moving unit as viewed in the first direction. With this configuration, even if the moving unit is moved, the second duct member properly receives the gas sent from the second blowing unit, thus suppressing diffusion of the gas.

The second blowing unit may be configured to generate an airflow moving faster than the airflow generated by the first blowing unit. With this configuration, it is possible for the airflow of the second blowing unit to properly draw and discharge the gas generated from the conveyance object.

A filter configured to adsorb as may be provided at an upstream side of the discharge opening. This configuration makes it possible to discharge clean gas outside of the system.

The interior of the casing may communicate with a load lock which is provided to carry the conveyance object into and out of a processing chamber and an accommodating box which is configured to accommodate the conveyance object. The first drive mechanism may be configured to slidingly move the moving unit in the first direction and in a second direction orthogonal to the first direction. The first drive mechanism may include: a first rail extending along the second direction; a gate-shaped frame arranged on the first rail; a first sliding drive mechanism configured to slidingly move the gate-shaped frame along the first rail; a second rail formed in the gate-shaped frame to extend in the first direction; and a second sliding drive mechanism configured to slidingly move the moving unit arranged on the second rail along the second rail. With this configuration, the moving unit can properly move within the casing in order to convey the conveyance object.

Another aspect of the present disclosure is directed to a substrate processing system, including: a conveyance device configured to convey a substrate within a casing; and a processing chamber in which the substrate conveyed by the conveyance device is processed. The conveyance device includes: a first blowing unit configured to generate airflow in a first direction within the casing; a discharge opening provided at a downstream side of the airflow generated by the first blowing unit and kept in communication with an interior of the casing, the discharge opening configured to discharge gas existing within the casing outside of the casing; a moving unit supported by a first drive mechanism arranged within the casing, the moving unit configured to move within the casing at a more downstream side than the first blowing unit and at a more upstream side than the discharge opening; an end effector provided in the moving unit and configured to mount the substrate thereon; and a second blowing unit installed in the moving unit and configured to generate an airflow in the first direction. The substrate processing system provides the same advantageous effects as provided by the aforementioned conveyance device.

According to various aspects and embodiments of the present disclosure, it is possible to suppress diffusion of a gas within a casing in which a substrate is conveyed.

DETAILED DESCRIPTION

Embodiments of the present disclosure will now be described in detail with reference to the accompanying drawings. In the subject specification and the drawings, components substantially identical in function and configuration will be designated by like reference symbols with duplicate description thereon omitted. Dimension ratios in the drawings do not necessarily coincide with those of the description.

First Embodiment

Figure 1:
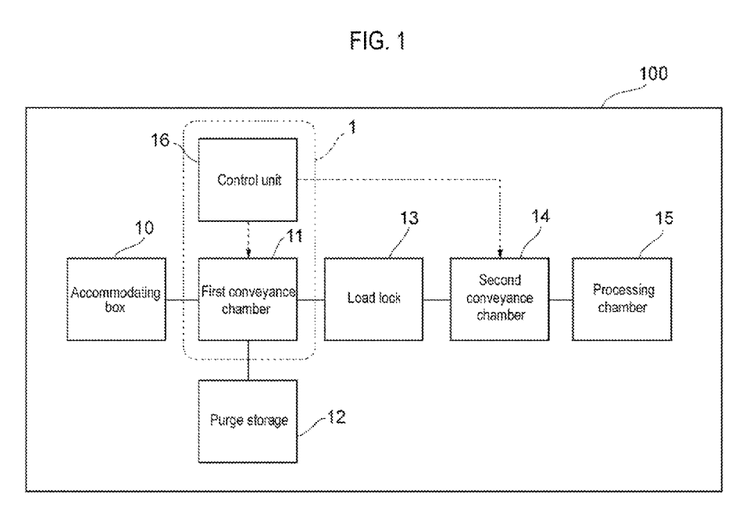
FIG. 1 is a configuration block diagram of a substrate processing system provided with a conveyance device according to a first embodiment.

FIG. 1 is a configuration block diagram of a substrate processing system 100 including a conveyance device 1 according to a first embodiment. The conveyance device 1 according to the present embodiment can be applied to the manufacture of devices such as a semiconductor, a compound semiconductor, an organic EL element and a solar cell. As shown in FIG. 1, the substrate processing system 100 includes an accommodating box 10, a first conveyance chamber 11, a purge storage 12, a load lock 13, a second conveyance chamber 14, a processing chamber 15 and a control unit 16.

The accommodating box 10 accommodates unprocessed substrates and processed substrates, e.g., wafers (conveyance objects). The accommodating box 10 is mounted on, e.g., a load port, and is in communication with the first conveyance chamber 11 through an opening/closing door mechanism. The first conveyance chamber 11 is in communication with the atmosphere. A conveyance arm as a component of the conveyance device 1 is arranged within the first conveyance chamber 11. The first conveyance chamber 11 is in communication with the purge storage 12. The purge storage 12 includes a mounting stand on which a wafer is temporarily mounted. The purge storage 12 temporarily accommodates a processed wafer. Furthermore, the first conveyance chamber 11 is in communication with the load lock 13 through, e.g., a gate valve capable of being opened and closed. The load lock 13 is connected to a vacuum pump and is configured such that the load lock 13 can be vacuum-drawn. The load lock 13 is in communication with the second conveyance chamber 14 through, e.g., a gate valve capable of being opened and closed. The second conveyance chamber 14 is connected to a vacuum pump and is configured such that the second conveyance chamber 14 can be vacuum-drawn. A conveyance mechanism is provided within the second conveyance chamber 14. The second conveyance chamber 14 is in communication with the processing chamber 15 through, e.g., a gate valve capable of being opened and closed. The processing chamber 15 is connected to a vacuum pump and is configured such that the processing chamber 15 can be vacuum-drawn. A processing mechanism that processes a wafer by dry etching, sputtering, depositing (CVD) and so forth is arranged within the processing chamber 15. Examples of gases used in the processing mechanism are as follows. A halogen gas such as a fluorine-based gas (e.g., $SF_6$), a chlorine-based gas (e.g., $Cl_2$), a bromine-based gas (e.g., HBr) or the like is used in a dry etching process. A depositing gas such as a chlorine-based gas (e.g., $TiCl_4$), a fluorine-based gas (e.g., $WF_6$) or the like is used in a depositing process. The control unit 16 is a device that includes, e.g., a CPU, a ROM, a RAM and so forth. The control unit 16 is configured to control the operation of the conveyance arm arranged in the first conveyance chamber 11 and the operation of the conveyance arm arranged in the second conveyance chamber 14.

In the substrate processing system 100 configured as above, an unprocessed wafer existing within the accommodating box 10 is carried out by the conveyance arm of the first conveyance chamber 11 and is carried into the load lock 13. The unprocessed wafer existing within the load lock 13 is carried out by the conveyance arm of the second conveyance chamber 14 and is carried into the processing chamber 15. After a specified process is finished, the processed wafer existing within the processing chamber 15 is carried out by the conveyance arm of the second conveyance chamber 14 and is carried into the load lock 13. The processed wafer existing within the load lock 13 is carried out by the conveyance arm of the first conveyance chamber 11 and is carried into the purge storage 12. After a specified time period lapses, the processed wafer is carried out from the purge storage 12 by the conveyance arm of the first conveyance chamber 11 and is carried into the accommodating box 10.

If necessary, the substrate processing system 100 may include a plurality of accommodating boxes 10, a plurality of purge storages 12, a plurality of load locks 13, a plurality of second conveyance chambers 14 and a plurality of processing chambers 15. The conveyance device 1 includes the components arranged within the first conveyance chamber 11 and the control unit 16.

Figure 2:
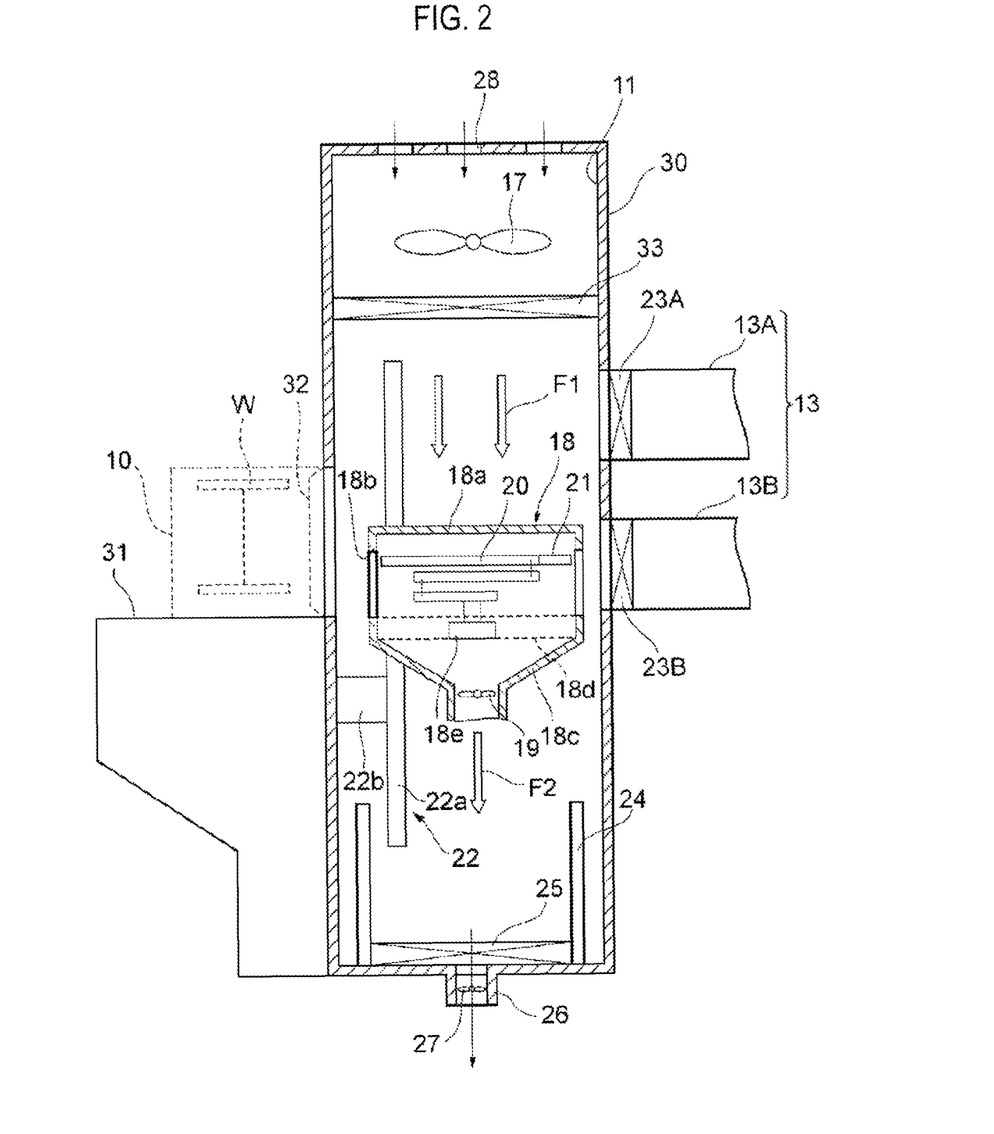
FIG. 2 is a sectional view of a first conveyance chamber within which the conveyance device according to the first embodiment is disposed.

Hereinafter, description will be made on the details of the first conveyance chamber 11 and the conveyance device 1. FIG. 2 is a schematic sectional view of the first conveyance chamber 11. Description will be made here by taking, as an example, a case where the substrate processing system 100 includes two load locks 13. As shown in FIG. 2, the first conveyance chamber 11 is defined within a casing 30. The first conveyance chamber 11 is connected to the accommodating box 10 mounted on a load port 31, through an opening/closing door mechanism 32. Moreover, the first conveyance chamber 11 is connected to load locks 13A and 13B through gate valves 23A and 23B.

A plurality of ventilation inlets 28 are provided in a ceiling portion of the casing 30. The casing 30 is configured such that air can be drawn from the atmosphere into the casing 30. Just below the ceiling portion, a primary blowing fan (a first blowing unit) 17 is arranged, and a primary filter 33 is arranged below the primary blowing fan 17. For example, a HEPA filter is used as the primary filter 33. Thus, a clean descending airflow (a down-flow) F1 is formed within the casing 30 in a direction facing downward from the upper side (in a first direction). A discharge opening 26 through which a gas existing within the casing 30 is exhausted outside of the system is formed in a bottom portion of the casing 30. In other words, the discharge opening 26 is provided at the more downstream side of the down-flow F1 than the primary blowing fan 17.

Figure 3:
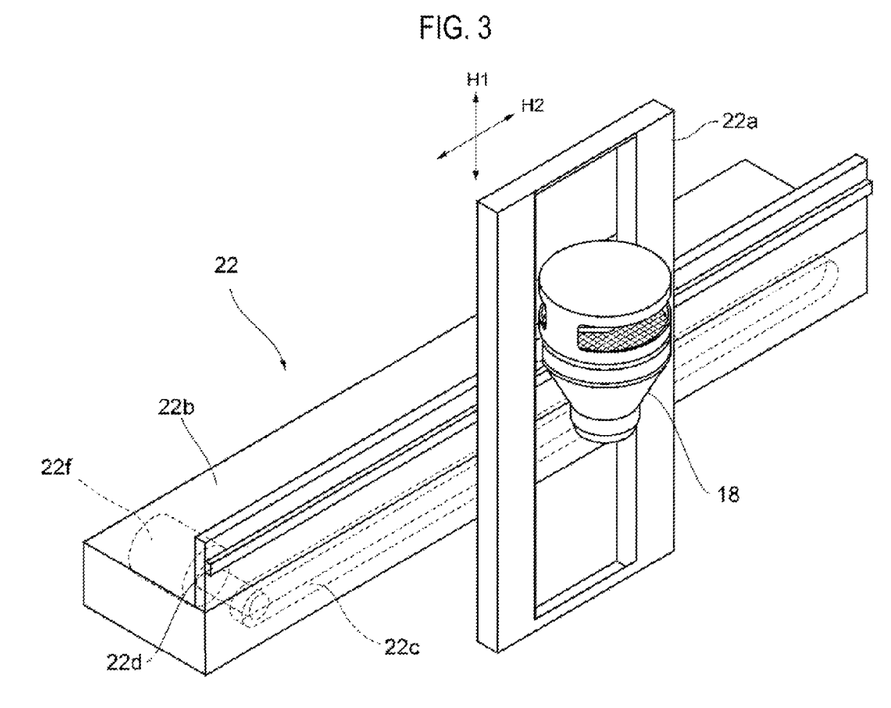
FIG. 3 is a perspective view of a gate-shaped conveyance arm shown in FIG. 2.

A moving support body (a first drive mechanism) 22 which supports a moving body 18 is arranged within the casing 30. The moving body 18 is accommodated within the casing 30. For example, a gate-shaped conveyance arm is used as the moving support body 22. Hereinafter, description will be made by taking, as an example, a case where the moving support body 22 is a gate-shaped conveyance arm. The gate-shaped conveyance arm 22 and the moving body 18 are arranged at the more downstream side of the down-flow F1 than the primary blowing fan 17 and at the more upstream side than the discharge opening 26. FIG. 3 is a schematic perspective view of the gate-shaped conveyance arm 22 and the moving body 18. As shown in FIGS. 2 and 3, the gate-shaped conveyance arm 22 includes a gate-shaped frame 22a and a horizontal frame 22b. The horizontal frame 22b extends along a longitudinal direction of the casing 30 (a second direction orthogonal to the first direction). The horizontal frame 22b includes a horizontal rail (a first rail) 22d. The gate-shaped frame 22a is slidably attached to the horizontal frame 22b. A motor 22f and a driving belt 22c, both of which serve as a drive mechanism (a first sliding drive mechanism), is disposed within the horizontal frame 22b. The gate-shaped frame 22a is configured to slide along the horizontal rail 22d.

Figure 4:
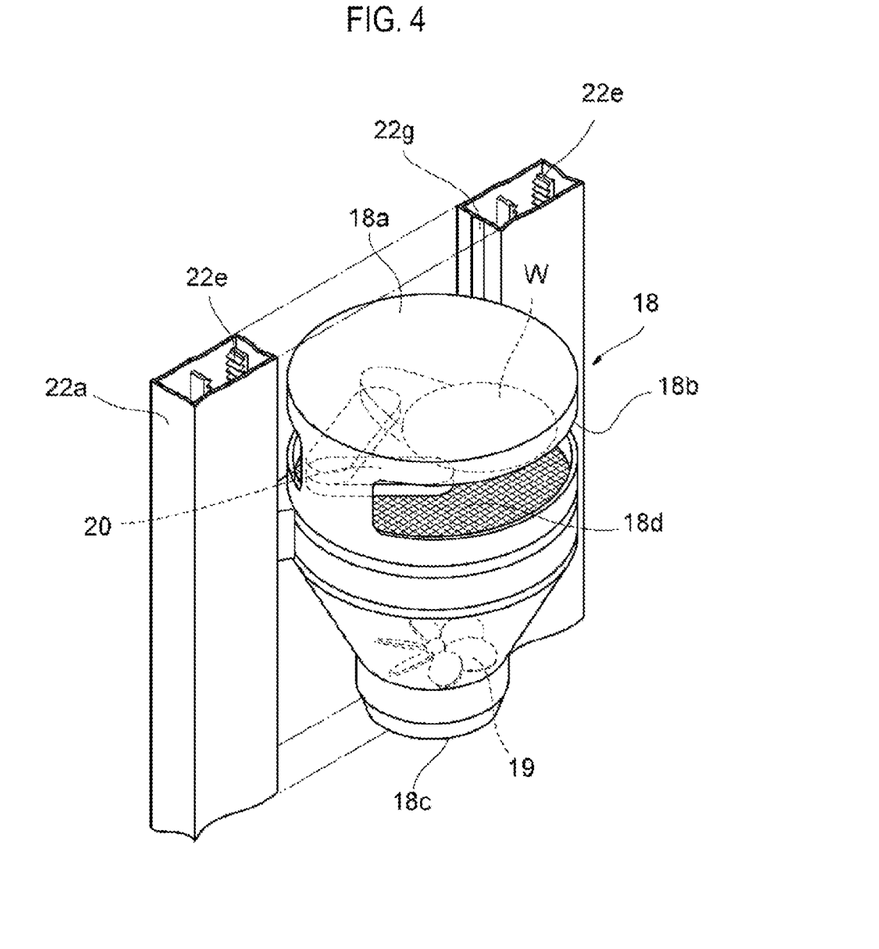
FIG. 4 is a perspective view of a moving body shown in FIG. 2.

The gate-shaped frame 22a includes a drive mechanism that slidingly drives the moving body 18 in the first direction. FIG. 4 is a schematic perspective view of the moving body 18. As shown in FIG. 4, a base (a moving unit) 18d of the moving body 18 is slidably attached to a vertical rail (a second rail) 22g extending along an inner circumference of the gate-shaped frame 22a. A driving belt 22e connected to a motor not shown, which serves as a drive mechanism (a second sliding drive mechanism), is arranged inside the gate-shaped frame 22a. The moving body 18 is configured to slidingly move along the vertical rail 22g.

As shown in FIGS. 2 and 4, the moving body 18 includes a base 18d, a conveyance arm (an arm unit) 20, an end effector 21, a blowing fan (a second blowing unit) 19, a robot case (a wind screen portion) 18a and an exhaust duct (a first duct member) 18c. The base 18d is has a substantially cylindrical shape and is configured such that air can flow from an upper side of the base 18d toward a lower side thereof. For example, the upper and lower surfaces of the base 18d are formed from a mesh-shaped material, a plurality of lattice-shaped materials or a material having a plurality of holes, so as to allow formation of an airflow without hindering a down-flow air stream. A conveyance arm 20 is disposed above the base 18d within the moving body 18. An arm drive mechanism 18e connected to the conveyance arm 20 is arranged inside the base 18d. The conveyance arm 20 is an articulated arm. The conveyance arm 20 is configured to rotate about a connection point at which the conveyance arm 20 is connected to the arm drive mechanism 18e. The conveyance arm 20 is configured such that it can be bent and stretched (extended and retracted)

in a radial direction. Alternatively, the conveyance arm 20 may be arranged outside the moving body 18.

The robot case 18a is box shaped and is attached to the base 18d so as to cover the conveyance arm 20 and the end effector 21. A window portion 18b is formed in a lateral side of the robot case 18a. The conveyance arm 20 and the end effector 21 can pass through the window portion 18b to deliver a wafer W. A ceiling portion of the robot case 18a is interposed between the end effector 21 and the primary blowing fan 17. The ceiling portion of the robot case 18a serves as a wind screen portion that obstructs a down-flow F1 generated by the primary blowing fan 17.

The blowing fan 19 is attached to the base 18d at the lower side of the base 18d in a state in which the blowing fan 19 is accommodated within the tubular exhaust duct 18c. In other words, the blowing fan 19 is provided at the more downstream side of the down-flow F1 than the ceiling portion of the robot case 18a. The blowing fan 19 generates a down-flow F2 along the direction of the down-flow F1. The down-flow F2 generated by the blowing fan 19 may be an airflow moving faster than the down-flow F1. An upper end opening of the exhaust duct 18c is connected to a lower surface of the base 18d. The down-flow F2 is exhausted from a lower end opening of the exhaust duct 18c. The exhaust duct 18c has a taper shape so as to become thinner toward the downstream side. This increases the velocity of the down-flow F2 and improves the directivity toward the discharge opening 26.

As shown in FIG. 2, a tubular accommodating duct (a second duct member) 24 is positioned to be upright in the inner wall of the casing 30 at the downstream side of the blowing fan 19 so as to surround the discharge opening 26. The accommodating duct 24 is provided along a movement route of the moving body 18 as viewed in the first direction. A filter 25 that adsorbs gas is provided inside the accommodating duct 24 and at the upstream side of the discharge opening 26. An auxiliary fan 27 for discharging gas outside of the system is arranged in the discharge opening 26. This makes it possible to efficiently dispose a gas so that the gas should not be diffused within the casing 30.

The conveyance device 1 includes the base 18d, the end effector 21 and the blowing fan 19, which are arranged within the casing 30 having the primary blowing fan 17 and the discharge opening 26. The control unit 16 moves the moving body 18 to a specified position by controlling the gate-shaped conveyance arm 22 of the conveyance device 1 and the arm drive mechanism 18e of the conveyance arm 20. In addition, the control unit may be configured to control the blowing-related components of the conveyance device 1.

Figure 5:
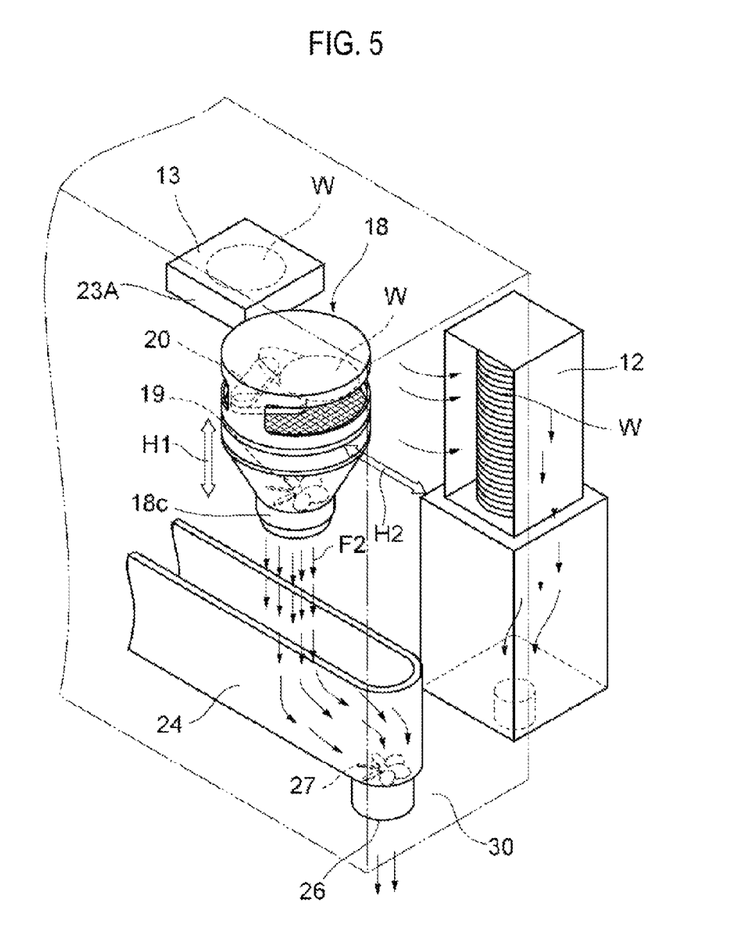
FIG. 5 is a schematic diagram illustrating the advantageous effects of the conveyance device shown in FIG. 2.

Next, description will be made on the advantageous effects of the conveyance device 1. FIG. 5 is a schematic diagram illustrating the advantageous effects of the conveyance device 1. As illustrated in FIG. 5, the moving body 18 slidingly moves along the first direction H1 and the second direction H2. A processed wafer W is carried out from the load lock 13A through the gate valve 23A by the conveyance arm 20 and is carried into the purge storage 12. At this time, the down-flow F1 is obstructed by the ceiling portion of the robot case 18a and does not directly reach the wafer W under conveyance. In other words, in the movement route of the wafer W extending from the load lock 13A to the purge storage 12, it is possible to prevent the down-flow F1 from directly reaching the processed wafer W and to prevent a gas involved in corrosion from being scattered into the first conveyance chamber 11. A gas R1 generated from the wafer W is drawn into the down-flow F2 generated by the blowing fan 19 and is blown from the exhaust duct 18c toward the accommodating duct 24. The gas R1 reaches the accommodating duct 24. Thereafter, the gas is drawn into the discharge opening 26 by the auxiliary fan 27 and is discharged outside of the system through the filter. In addition, the gas existing within the purge storage 12 is purified and is discharged outside of the system.

According to the conveyance device 1 of the first embodiment described above, the down-flow F1 generated by the primary blowing fan 17 reaches the end effector 21 on which the wafer W is mounted. Then, the down-flow F1 reaches the discharge opening 26. The down-flow F2 generated by the blowing fan 19 reaches the discharge opening 26 while drawing the gas existing near the end effector 21. The gas R1 involved in corrosion, which is generated from the processed wafer W, reaches the discharge opening 26 together with the down-flow F2. This makes it possible to, by virtue of the down-flow F2, discharge the gas R1 while restraining the gas R1 from being diffused into the casing 30. By preventing the diffusion of the gas R1 in this manner, the need to apply an anti-corrosion coating on the inner surface of the first conveyance chamber is eliminated. It is therefore possible to save costs. By preventing the diffusion of the gas R1, it becomes unnecessary to perform maintenance work by which the first conveyance chamber is replaced as a whole. It is therefore possible to reduce the maintenance frequency, the burden of replacement work and replacement time.

In the base 18d, there is provided the robot case 18a which is interposed between the end effector 21 and the primary blowing fan 17 to obstruct the airflow generated by the first blowing unit and moving in the first direction. The blowing fan 19 is arranged at the more downstream side than the robot case 18a. It is therefore possible to prevent the down-flow F1 from directly reaching the wafer W. This makes it possible to further suppress the diffusion of the gas generated from the wafer W.

The robot case 18a has a cylindrical shape and accommodates the end effector 21 therein. The robot case 18a is provided in the base 18d with the blowing fan 19 accommodated within the tubular exhaust duct 18c. It is therefore possible to draw the gas generated from the wafer W into the down-flow F2 and to properly discharge the gas. Since the exhaust duct 18c has a taper shape so as to become thinner toward the downstream side, it is possible to properly orient the down-flow F2 toward the discharge opening 26 and to appropriately cause the down-flow F2 to reach the discharge opening 26 at an increased velocity. Moreover, the end effector 21 is supported on the base 18d by the conveyance arm 20 capable of being extended and retracted. The robot case 18a has the window portion 18b through which the end effector 21 and the conveyance arm 20 can pass. It is therefore possible to make the delivery of the wafer W and the suppression of the gas diffusion compatible. In addition, the tubular accommodating duct 24 surrounding the discharge opening 26 is arranged in the inner wall of the casing at the downstream side of the blowing fan 19. Thus, the accommodating duct 24 can properly receive the down-flow F2. This makes it possible to suppress the diffusion of gas. In addition, the accommodating duct 24 is provided along the movement route of the base 18d as viewed in the first direction. Therefore, even if the base 18d is moved, the accommodating duct 24 can appropriately receive the down-flow F2. This makes it possible to suppress the diffusion of gas. Since the blowing fan 19 generates the down-flow F2 moving faster than the down-flow F1, it is possible for the down-flow F2 to properly draw and discharge the gas R1 generated from the wafer W. Inasmuch as the filter 25 that adsorbs the gas R1 is arranged at the upstream side of the discharge opening 26, it is possible to discharge clean gas outside of the system. Employment of the gate-shaped conveyance arm 22 makes it possible to include the exhaust duct 18c and the accommodating duct 24 without adversely affecting the conveyance operation.

Second Embodiment

The conveyance device 1 of the second embodiment is substantially identical in configuration with the conveyance device 1 of the first embodiment. The conveyance device 1 of the second embodiment differs from the conveyance device 1 of the first embodiment only in the configuration of the moving body 18. In the following description, for the sake of easier understanding of the description, points differing from the first embodiment will be primarily described with duplicate description omitted.

Figure 6:
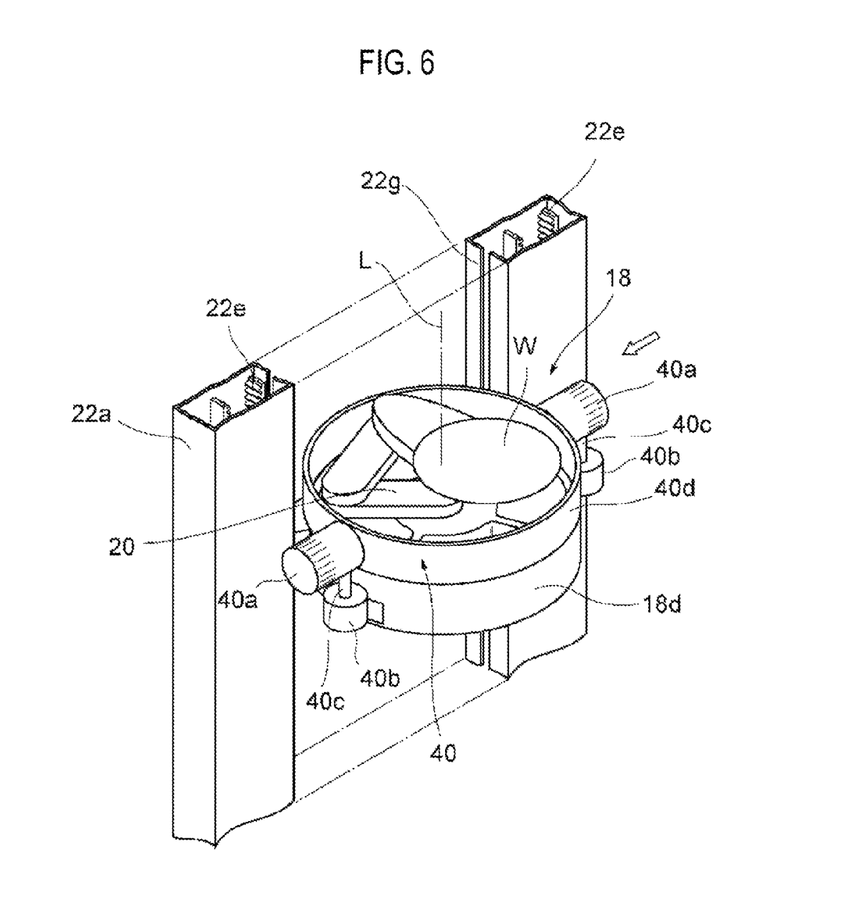
FIG. 6 is a perspective view of a moving body according to a second embodiment.

FIG. 6 is a schematic perspective view of the moving body 18 of the conveyance device 1 according to the present embodiment. As shown in FIG. 6, the moving body 18 includes a base 18d, a conveyance arm 20 and a blowing unit (a second blowing unit) 40. Mechanisms of the conveyance system remain the same as those of the first embodiment.

The blowing unit 40 is a tubular fan-concealed blower. A body portion 40d of the blowing unit 40 is a tubular member opened at the opposite ends thereof. The body portion 40d has a diameter large enough to accommodate the conveyance arm 20 and the end effector on which a wafer W is mounted. The blowing unit 40 is located in the base 18d so that the center axis L of the body portion 40d can be oriented in the first direction and so that the end effector and the wafer W can be positioned inside the opening of the body portion 40d as viewed in the first direction.

On the lateral side of the body portion 40d, projections 40a are provided in diametrically opposite positions. On the lateral side of the base 18d, extending/retracting drive mechanisms (second drive mechanisms) capable of extending and retracting in the first direction are provided in a corresponding relationship with the projections 40a. Each of the extending/retracting drive mechanisms includes an extending/retracting member 40c and a drive unit 40b that drives and supports the extending/retracting member 40c. Each of the projections 40a of the body portion 40d and each of the extending/retracting members 40c of the base 18d are connected to each other. Thus, the blowing unit 40 is supported on the base 18d so that the blowing unit 40 can be driven in the first direction.

Figure 7:
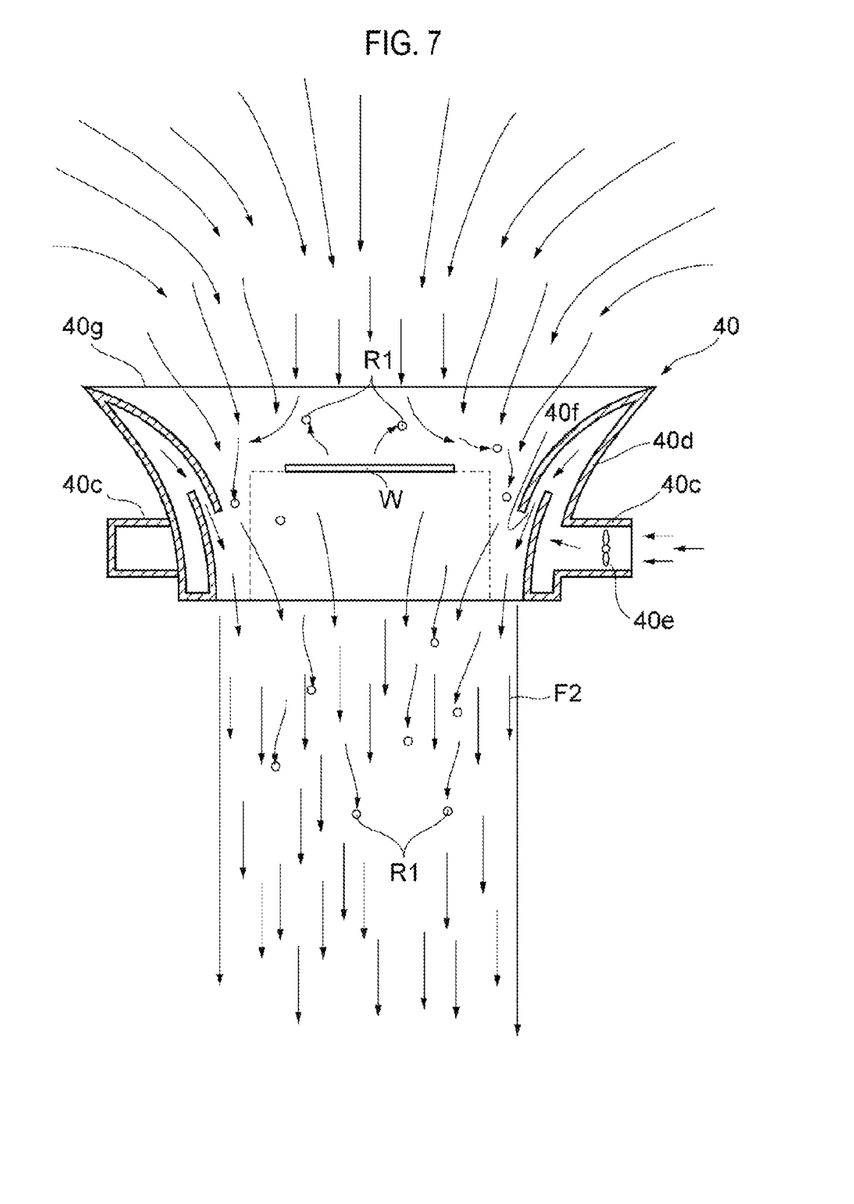
FIG. 7 is a schematic diagram illustrating an operational principle of the moving body shown in FIG. 6.

As shown in FIG. 7, the body portion 40d of the blowing unit 40 has a hollow structure and is configured so that a gas can flow therethrough. Each of the projections 40a is a tubular member opened at the opposite ends thereof. One end of each of the projections 40a is attached to the body portion 40d so that each of the projections 40a can communicate with the interior of the body portion 40d. A blowing fan 40e is accommodated within each of the projections 40a. A slit (an ejecting portion) 40f that ejects a gas toward the opening of the body portion 40d is formed to extend along the inner circumference of the body portion 40d.

With this configuration, upon rotation of the blowing fan 40e, a gas is blown from each of the projections 40a into the body portion 40d and is ejected from the annular slit 40f in the first direction. The gas thus ejected draws a gas existing inside the body portion 40d and a gas existing above the body portion 40d and flows in the first direction. Thus, there is formed a down-flow F2 having a strong directivity toward the opening of the body portion 40d. The down-flow F2 draws a gas R1 generated from the wafer W and flows in the first direction.

The control unit 16 is configured to adjust the relative position (height position) of the blowing unit 40 with respect to the base 18d, the conveyance arm 20, the end effector 21 and the wafer W by controlling the extending/retracting drive mechanisms. Other configurations than the blowing unit 40 are identical with those of the conveyance device 1 according to the first embodiment.

Figure 8:
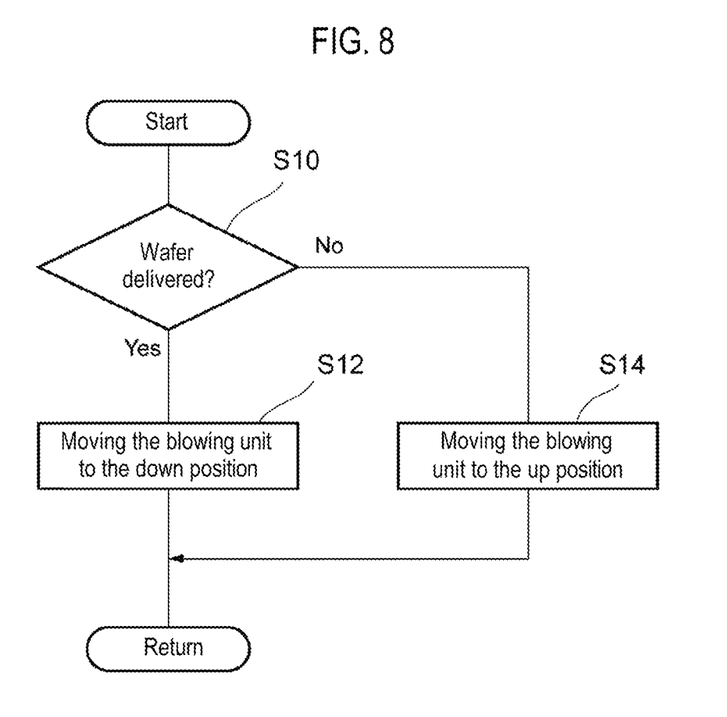
FIG. 8 is a flowchart illustrating an operation of a control unit according to a second embodiment.

Next, description will be made on the relative position adjusting operation of the conveyance device 1. FIG. 8 is a flowchart illustrating the operation of the conveyance device 1. The control process illustrated in FIG. 8 is repeatedly performed, e.g., at a specified interval from the timing at which a wafer conveyance process is implemented in the conveyance device 1.

Figure 9:
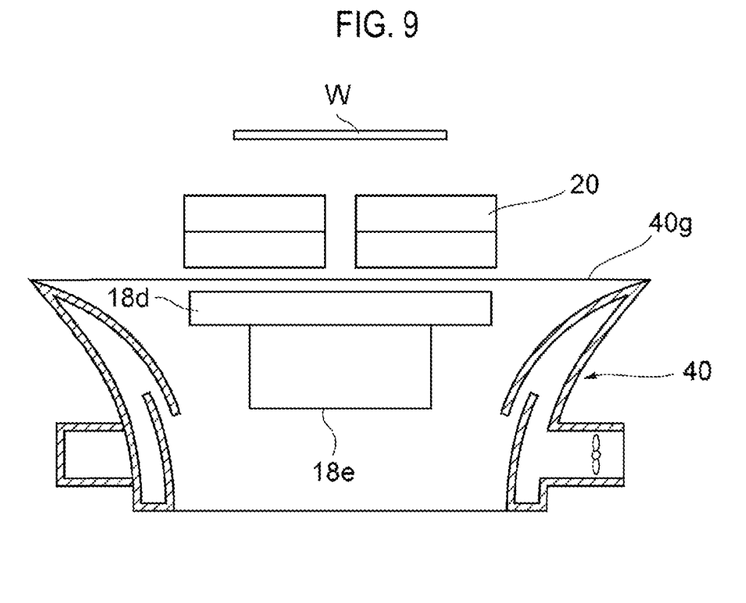
FIG. 9 is a schematic diagram illustrating a first movement position of a second blowing unit shown in FIG. 6.

As illustrated in FIG. 8, the control unit 16 determines whether it is the time to deliver the wafer W to the end effector 21 (S10). For example, the control unit 16 acquires a delivery timing of the wafer W by referring to a processing schedule of the wafer W provided in a memory and determines whether it is time to mount the wafer W on the end effector 21. If the control unit 16 determines in step S10 that the delivery of the wafer W is to be performed, the flow proceeds to a position adjusting process (S12). In the process of S12, the control unit 16 controls the extending/retracting drive mechanisms to move the blowing unit 40 to a down position. FIG. 9 is a schematic view illustrating the down position of the blowing unit 40. In order to explain the height position of the blowing unit 40, the extending/retracting drive mechanisms are not shown in FIG. 9. As illustrated in FIG. 9, the down position is a position where the upper end 40g of the blowing unit 40 is located lower than (at the more downstream side than) the conveyance arm 20. This makes it possible to generate an airflow moving in the first direction without hindering the carry-in/carry-out operation of the conveyance arm 20 during the delivery of the wafer W. If the process of S12 is finished, the control process shown in FIG. 8 comes to an end.

Figure 10:
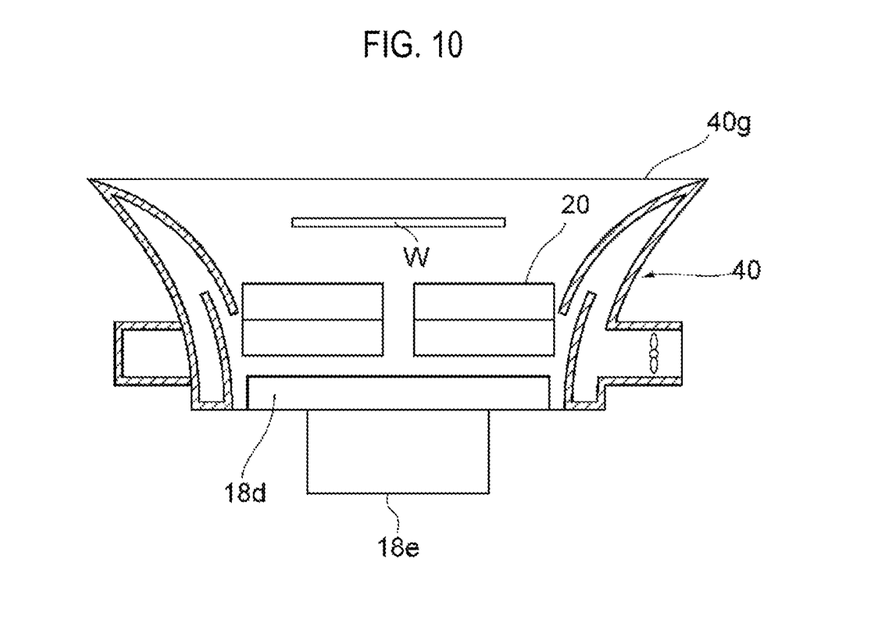
FIG. 10 is a schematic diagram illustrating a second movement position of the second blowing unit shown in FIG. 6.

On the other hand, if the control unit 16 determines in step S10 that the delivery of the wafer W is not to be performed, the flow proceeds to a position adjusting process (S14). In the process of S14, the control unit 16 controls the extending/retracting drive mechanisms to move the blowing unit 40 to an up position. FIG. 10 is a schematic view illustrating the up position of the blowing unit 40. In order to explain the height position of the blowing unit 40, the extending/retracting drive mechanisms are not shown in FIG. 10. As illustrated in FIG. 10, the up position is a position where the upper end 40g of the blowing unit 40 is located higher than (at the more upstream side than) the arrangement position of the wafer W (namely, the height position of the end effector 21). In other words, the up position is a position where the end effector 21 is accommodated within the body portion 40d of the blowing unit 40. Thus, the wafer W can be accommodated within the body portion 40d of the blowing unit 40 during the conveyance of the wafer W (during the movement of the moving body 18). It is therefore possible to properly draw and blow a gas existing near the wafer W. If the process of S14 is finished, the control process shown in FIG. 8 comes to an end.

The control process shown in FIG. 8 is finished in the aforementioned manner. By performing the control process shown in FIG. 8, the height position of the blowing unit 40 is differently adjusted during the delivery of the wafer W and during the conveyance of the wafer W.

Figure 11:
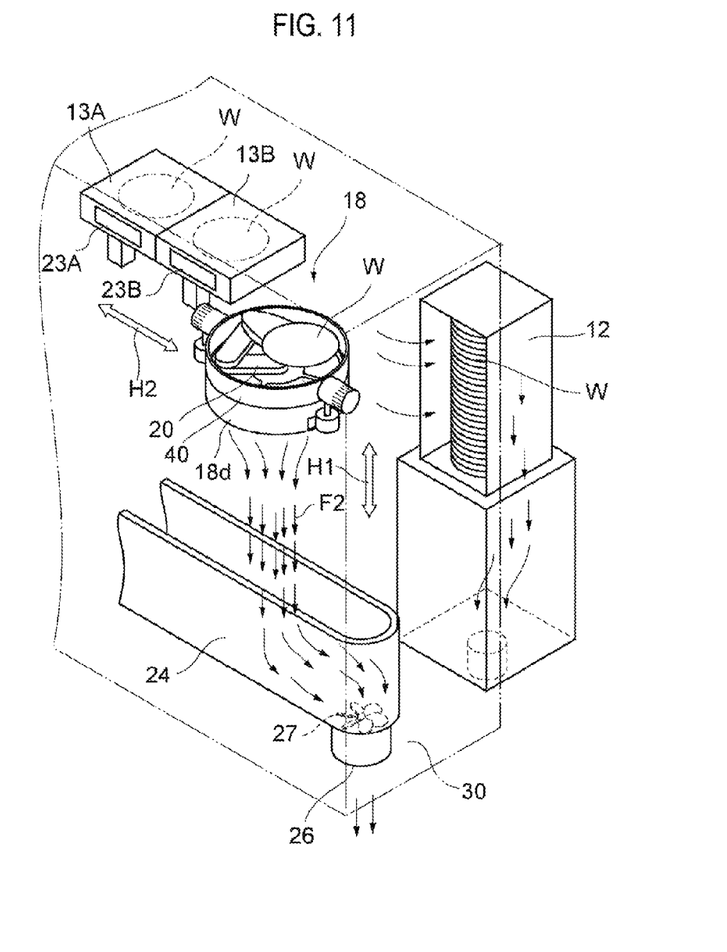
FIG. 11 is a schematic diagram illustrating the advantageous effects of a conveyance device according to a second embodiment.

Next, description will be made on the advantageous effects of the conveyance device 1. FIG. 11 is a schematic diagram illustrating the advantageous effects of the conveyance device 1. As illustrated in FIG. 11, the moving body 18 slidingly moves in the first direction H1 and the second direction H2. The processed wafer W is carried out from the load lock 13A through the gate valve 23A by the conveyance arm 20 and is carried into the purge storage 12. At this time, the blowing unit 40 moves to the down position during the delivery of the wafer W. Thus, the compatibility of the delivery of the wafer W and the exhaust is realized. On the other hand, the blowing unit 40 moves to the up position during the conveyance of the wafer W. Thus, the gas R1 generated from the wafer W can be further drawn into the airflow (see FIG. 7). The down-flow F2 having a high flow velocity can be formed by the fan-concealed blowing unit 40. Therefore, even if the down-flow F1 directly reaches the wafer W under conveyance, the gas R1 is blown from the exhaust duct 18c toward the accommodating duct 24 without being diffused. The gas R1 reaches the accommodating duct 24. Thereafter, the gas R1 is drawn into the discharge opening 26 by the auxiliary fan 27 and is discharged outside of the system through the filter. In addition, the gas existing within the purge storage 12 is purified and discharged outside of the system.

According to the conveyance device 1 of the second embodiment described above, it is possible to provide the same advantageous effects as provided by the first embodiment. Since the fan-concealed blowing unit 40 is provided in the base 18d of the moving body 18, it is possible to increase the velocity and the directivity of the down-flow F2. Inasmuch as the blowing unit 40 is supported on the base 18d by the second drive mechanism capable of extending and retracting in the first direction, the position of the blowing unit 40 can be changed without changing the direction of the airflow generated by the blowing unit 40. The relative position of the blowing unit 40 and the end effector 21 can be changed from the time of the delivery of the wafer W and until the conveyance of the wafer W. Thus, the delivery of the conveyance object and the suppression of diffusion of the gas R1 can be made compatible. When mounting the wafer W on the end effector 21 and moving the wafer W, the control unit 16 controls the operation of the second drive mechanism so as to move the blowing unit 40 to the position where the end effector is accommodated within the blowing unit 40. It is therefore possible to suppress the diffusion of the gas R1 during the conveyance of the wafer W.

Each of the embodiments described above merely illustrates one example of the conveyance device 1. The conveyance device 1 of each of the embodiments may be modified or may be applied to other systems.

For example, in the embodiments described above, description has been made of an example in which the gate-shaped conveyance arm 22 is used as the conveyance mechanism of the moving body 18 and in which the articulated conveyance arm 20 is used as the conveyance mechanism of the wafer W. However, other conveyance mechanisms may be used as long as they can smoothly convey the moving body 18 at a high speed.

In the embodiments described above, description has been made of a case where the primary blowing fan 17 generates the down-flow F1 in the direction facing downward from the upper side of the casing 30 (in the first direction). However, the blowing direction of the primary blowing fan 17 is not limited thereto. As an example, the left-right direction of the casing 30 may be the first direction.

In the second embodiment described above, description has been made of an example in which the blowing unit 40 is attached so as to make relative movement with respect to the base 18d. However, the blowing unit 40 may be fixed to the base 18d.

EXPLANATION OF REFERENCE NUMERALS

1: conveyance device, 10: accommodating box, 11: first conveyance chamber, 13: load lock, 15: processing chamber, 16: control unit, 17: primary blowing fan (first blowing unit), 18: moving body, 18a: robot case (wind screen portion), 18b: window portion, 18c: exhaust duct (first duct member), 18d: base (moving unit), 19: blowing fan (second blowing unit), 20: conveyance arm (arm unit), 21: end effector, 22: moving support body or gate-shaped conveyance arm (first drive mechanism), 22a: gate-shaped frame, 22c: driving belt (first sliding drive mechanism), 22d: horizontal rail (first rail), 22e: driving belt (second sliding drive mechanism), 22g: vertical rail (second rail), 24: accommodating duct (second duct member), 25: filter, 26: discharge opening, 30: casing, 40: blowing unit (second blowing unit), 40b: drive unit (second drive mechanism), 40d: body portion, 40e: blowing fan, 40f: slit, 100: substrate processing system

What is claimed is:

1. A conveyance device for conveying a conveyance object within a casing, comprising:
    a first blowing unit configured to generate an airflow in a first direction within the casing;
    a discharge opening provided at a downstream side of the airflow generated by the first blowing unit and configured to discharge a gas existing within the casing outside of the casing;
    a moving unit supported by a first drive mechanism arranged within the casing, the moving unit configured to move within the casing at a more downstream side than the first blowing unit and at a more upstream side than the discharge opening;
    an end effector located in the moving unit and configured to mount the conveyance object thereon; and
    a second blowing unit located in the moving unit and configured to generate an airflow in the first direction,
    wherein the second blowing unit includes a tubular body portion opened at the opposite ends thereof and an ejecting portion formed along an inner side of the body portion and configured to eject a gas in the first direction, and
    the second blowing unit is located in the moving unit such that a center axis of the body portion is oriented in the first direction and such that the end effector is positioned inside an opening of the body portion as viewed in the first direction.

2. The device of claim 1, wherein the second blowing unit is supported on the moving unit by a second drive mechanism capable of extending and retracting in the first direction.

3. The device of claim 2, further comprising:
    a control unit configured to control an operation of the second drive mechanism so as to change a relative position of the second blowing unit and the end effector between the time when the conveyance object is mounted on the end effector and when the conveyance object mounted on the end effector is moved.

4. The device of claim 3, wherein, when the conveyance object mounted on the end effector is moved, the control unit controls the operation of the second drive mechanism so as to move the second blowing unit to a position where the end effector is accommodated within the second blowing unit.

5. The device of claim 1, wherein a tubular second duct member provided so as to surround the discharge opening is provided on an inner wall of the casing at a downstream side of the second blowing unit.

6. The device of claim 5, wherein the second duct member is provided along a movement route of the moving unit as viewed in the first direction.

7. The device of claim 1, wherein the second blowing unit is configured to generate an airflow moving faster than the airflow generated by the first blowing unit.

8. The device of claim 1, wherein a filter configured to adsorb a gas is provided at an upstream side of the discharge opening.

9. The device of claim 1, wherein the interior of the casing communicates with a load lock which is provided to carry the conveyance object into and out of a processing chamber and an accommodating box which is configured to accommodate the conveyance object.

10. The device of claim 1, wherein the first drive mechanism is configured to slidingly move the moving unit in the first direction and in a second direction orthogonal to the first direction.

11. The device of claim 10, wherein the first drive mechanism includes:
   a first rail extending along the second direction;
   a gate-shaped frame arranged on the first rail;
   a first sliding drive mechanism configured to slidingly move the gate-shaped frame along the first rail;
   a second rail formed in the gate-shaped frame to extend in the first direction; and
   a second sliding drive mechanism configured to slidingly move the moving unit arranged on the second rail along the second rail.

12. A substrate processing system, comprising:
   a conveyance device configured to convey a substrate within a casing; and
   a processing chamber in which the substrate conveyed by the conveyance device is processed,
   wherein the conveyance device comprises:
   a first blowing unit configured to generate an airflow in a first direction within the casing;
   a discharge opening provided at a downstream side of the airflow generated by the first blowing unit and configured to discharge a gas existing within the casing outside of the casing;
   a moving unit supported by a first drive mechanism arranged within the casing, the moving unit configured to move within the casing at a more downstream side than the first blowing unit and at a more upstream side than the discharge opening;
   an end effector provided in the moving unit and configured to mount the substrate thereon; and
   a second blowing unit provided in the moving unit and configured to generate an airflow in the first direction,
   wherein the second blowing unit includes a tubular body portion opened at the opposite ends thereof and a ejecting portion formed along an inner side of the body portion and configured to eject a gas in the first direction, and
   the second blowing unit is located in the moving unit such that a center axis of the body portion is oriented in the first direction and such that the end effector is positioned inside an opening of the body portion as viewed in the first direction.

* * * * *